United States Patent
Chan et al.

(10) Patent No.: US 10,418,554 B2
(45) Date of Patent: *Sep. 17, 2019

(54) METHODS OF FORMING MEMORY CELLS AND SEMICONDUCTOR DEVICES

(71) Applicant: Micron Technology, Inc., Boise, ID (US)

(72) Inventors: Tsz W. Chan, Boise, ID (US); D. V. Nirmal Ramaswamy, Boise, ID (US); Qian Tao, Boise, ID (US); Yongjun Jeff Hu, Boise, ID (US); Everett A. McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/172,260

(22) Filed: Oct. 26, 2018

(65) Prior Publication Data

US 2019/0067573 A1 Feb. 28, 2019

Related U.S. Application Data

(60) Division of application No. 15/642,673, filed on Jul. 6, 2017, now Pat. No. 10,193,064, which is a
(Continued)

(51) Int. Cl.
*H01L 45/00* (2006.01)
*H01L 27/24* (2006.01)

(52) U.S. Cl.
CPC ........ *H01L 45/145* (2013.01); *H01L 27/2427* (2013.01); *H01L 45/04* (2013.01);
(Continued)

(58) Field of Classification Search
CPC .. H01L 45/1233; H01L 45/1253; H01L 45/16
See application file for complete search history.

(56) References Cited

U.S. PATENT DOCUMENTS

| 5,151,384 A | 9/1992 | Williams |
| 5,177,567 A | 1/1993 | Klersy et al. |

(Continued)

FOREIGN PATENT DOCUMENTS

CA 1162327 2/1984

OTHER PUBLICATIONS

Majumdar et al., Contact Resistance Improvement by Dielectric Breakdown in Semiconductor-Dielectric-Metal Contact, Applied Physics Letters, vol. 102, (2013), pp. 113505-1-113505-4.

*Primary Examiner* — Mark V Prenty
(74) *Attorney, Agent, or Firm* — TraskBritt

(57) ABSTRACT

A memory cell comprising a threshold switching material over a first electrode on a substrate. The memory cell includes a second electrode over the threshold switching material and at least one dielectric material between the threshold switching material and at least one of the first electrode and the second electrode. A memory material overlies the second electrode. The dielectric material may directly contact the threshold switching material and each of the first electrode and the second electrode. Memory cells including only one dielectric material between the threshold switching material and an electrode are disclosed. A memory device including the memory cells and methods of forming the memory cells are also described.

18 Claims, 15 Drawing Sheets

Related U.S. Application Data continuation of application No. 14/476,312, filed on Sep. 3, 2014, now Pat. No. 9,716,225.

(52) U.S. Cl.
CPC ........ *H01L 45/1253* (2013.01); *H01L 45/141* (2013.01); *H01L 45/1608* (2013.01)

(56) References Cited

U.S. PATENT DOCUMENTS

| | | |
|---|---|---|
| 5,920,788 A | 7/1999 | Reinberg |
| 6,229,157 B1 | 5/2001 | Sandhu |
| 6,955,940 B2 | 10/2005 | Campbell et al. |
| 7,446,393 B2 | 11/2008 | Li et al. |
| 7,485,503 B2 | 2/2009 | Brask et al. |
| 7,646,630 B2 | 1/2010 | Lowrey et al. |
| 7,709,289 B2 | 5/2010 | Daley et al. |
| 8,044,489 B2 | 10/2011 | Matsui |
| 8,183,553 B2 | 5/2012 | Phatak et al. |
| 8,525,252 B2 | 9/2013 | Toratani et al. |
| 8,659,929 B2 | 2/2014 | Kumar |
| 8,723,154 B2 | 5/2014 | Jo et al. |
| 8,981,327 B1 | 3/2015 | Mathur et al. |
| 9,716,225 B2 | 7/2017 | Chan et al. |
| 9,905,757 B2 * | 2/2018 | Choi ...................... H01L 45/08 |
| 10,193,064 B2 * | 1/2019 | Chan ..................... H01L 45/145 |
| 2003/0047727 A1 | 3/2003 | Chiang |
| 2010/0078758 A1 | 4/2010 | Sekar et al. |
| 2012/0267632 A1 | 10/2012 | Ramaswamy et al. |
| 2013/0043508 A1 | 2/2013 | Merckling |
| 2013/0048935 A1 | 2/2013 | Gotti et al. |
| 2013/0069030 A1 | 3/2013 | Wells et al. |
| 2013/0256624 A1 | 10/2013 | Kau |
| 2015/0207066 A1 | 7/2015 | Ohba et al. |
| 2016/0064666 A1 | 3/2016 | Chan et al. |

\* cited by examiner

METHODS OF FORMING MEMORY CELLS AND SEMICONDUCTOR DEVICES

CROSS-REFERENCE TO RELATED APPLICATIONS

This application is a divisional of U.S. patent application Ser. No. 15/642,673, filed Jul. 6, 2017, and titled "MEMORY CELLS INCLUDING DIELECTRIC MATERIALS, MEMORY DEVICES INCLUDING THE MEMORY CELLS, AND METHODS OF FORMING SAME," now U.S. Pat. No. 10,193,064, issued Jan. 29, 2019, which is a continuation of U.S. patent application Ser. No. 14/476,312, filed Sep. 3, 2014, titled "MEMORY CELLS INCLUDING DIELECTRIC MATERIALS, MEMORY DEVICES INCLUDING THE MEMORY CELLS, AND METHODS OF FORMING SAME," now U.S. Pat. No. 9,716,225, issued on Jul. 25, 2017, the disclosure of each of which is hereby incorporated herein in its entirety by this reference.

TECHNICAL FIELD

Embodiments disclosed herein relate to memory devices providing improved electrical properties, and methods of forming such devices. More specifically, embodiments disclosed herein relate to memory devices including memory cells with dielectric materials between electrodes and threshold switching materials to improve device performance, and methods of forming such memory cells and memory devices.

BACKGROUND

Conventional memory cells are configured to read and write data by applying a voltage to a memory material. A voltage is applied to the memory material through electrodes coupled to each end of the memory cell. The memory material is set to a particular resistance state according to an amount of current applied by the electrodes. The resistance state of the memory material may be used to distinguish a logic value of the memory cell.

In addition to the memory material, a conventional memory cell may also include an isolation element (e.g., a switch, a select device, etc.) configured to be reversibly electrically switched from a resistive state to a conductive state. Within a conventional memory device, a plurality of memory cells is positioned between a plurality of access lines (e.g., word lines) and a plurality of digit lines (e.g., bit lines). A single cell is selected for reading and writing by applying a voltage between the access line and the digit line associated with a particular memory cell. Including the isolation element impairs or, ideally, prevents, residual voltages from affecting the physical state (e.g., the resistance) of non-selected memory cells.

Threshold switching materials are currently considered favorable isolation elements, such as in, for example, cross-point architecture memory cells. At a threshold voltage, the threshold switching material changes to an electrically conductive state, allowing current to flow through the threshold switching material. Below the threshold voltage, the threshold switching material is in a resistive state, limiting leakage current flow through the threshold switching material.

The threshold switching material may be formed between a pair of electrodes of the memory cell, through which current flows to and from the threshold switching material. Conventional threshold switching materials include materials that undesirably react with the materials of the electrodes surrounding the threshold switching materials. The threshold switching materials often react with the materials that form the electrodes. In addition, the threshold switching material may diffuse into the electrode and materials from the electrode may diffuse into the threshold switching material, forming a discontinuous interface between the electrodes and the threshold switching material. For example, this diffusion of materials occurs in conventional memory cells at an interface between a metal electrode and an amorphous silicon threshold switching material, or at an interface between a carbon electrode and a chalcogenide threshold switching material.

Disadvantageously, however, these reactions between the threshold switching material and the surrounding electrodes cause electrical defects at the interface between the threshold switching material and the electrodes, reducing the electrical quality of the switch and the associated memory cell. For example, the poor interface may cause a phenomenon known as Fermi level pinning, which often increases the threshold voltage of each memory cell, increases the threshold voltage variability across individual memory cells within a memory array, increases the leakage current through the threshold switching material at sub-threshold voltages, and reduces the useful lifetime of the switch.

DETAILED DESCRIPTION

Figure 1A:
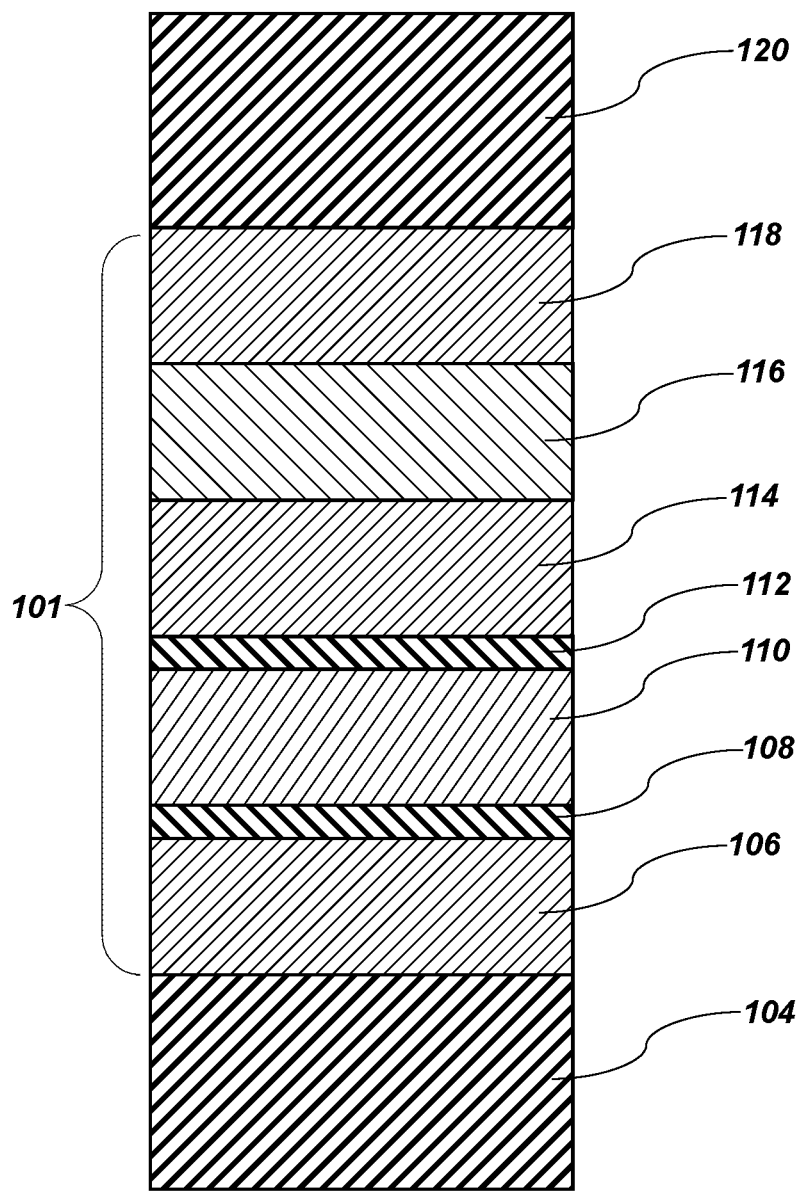
FIG. 1A and FIG. 1B are simplified cross-sectional views of a memory cell including dielectric materials adjacent a threshold switching material according to some embodiments of the present disclosure.

The illustrations included herewith are not meant to be actual views of any particular systems or memory structures, but are merely idealized representations that are employed to describe embodiments herein. Elements and features common between figures may retain the same numerical designation except that, for ease of following the description, for the most part, reference numerals begin with the number of the drawing on which the elements are introduced or most fully discussed.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not describe the formation of a complete process flow for manufacturing memory cells, and the structures described below do not form a complete semiconductor device. Only those process acts and structures necessary to understand the embodiments described herein are described in detail below. Additional acts to form a complete a semiconductor device including the structures described herein may be performed by conventional techniques.

In some embodiments disclosed herein, a dielectric material between a threshold switching material (e.g., a material that may be used in an isolation element such as a select device or an access device) and an electrode may improve device performance of a memory cell. The dielectric material may be positioned between the threshold switching material and the electrode and may reduce the number of electrical defects at an interface of the threshold switching material with other materials (e.g., the electrodes) of the memory cell. The dielectric material may increase the probability that each memory cell in a memory array has a threshold voltage closer to the average threshold voltage of the memory cells in the memory array compared to conventional memory cells in conventional memory arrays, decrease the threshold voltage of the memory cells in the memory array, and increase the number of cycles each memory cell may undergo while remaining stable.

According to embodiments disclosed herein, the dielectric material may be formed in cross-point memory cells. The memory cells may be comprised of various materials, depending on the desired function of the final device. The dielectric material may be formed between the threshold switching material and an electrode adjacent the threshold switching material. In other embodiments, the dielectric material is formed between the threshold switching material and each of the adjacent electrodes. In some embodiments, the threshold switching material is in direct contact with the dielectric material and the dielectric material separates the threshold switching material from the electrodes adjacent the threshold switching material.

Referring to FIG. 1A, a memory cell 101 may include a first electrode 106 (e.g., a bottom electrode), a first dielectric material 108 over the first electrode 106, a threshold switching material 110 over the first dielectric material 108, a second dielectric material 112 over the threshold switching material 110, a second electrode 114 (e.g., a middle electrode) over the second dielectric material 112, a memory material 116 over the second electrode 114, and a third electrode 118 (e.g., a top electrode) over the memory material 116. The memory cell 101 may be coupled to access lines, such as a word line 104 which may underlie the first electrode 106 and a digit line 120 (e.g., a bit line) which may overlie the third electrode 118. The memory material 116 may be electrically coupled to the threshold switching material 110 through the second electrode 114.

The word line 104 may include any suitable material including, but not limited to, a conductive material such as a metal, a metal alloy, a conductive metal oxide, or combinations thereof. For example, the word line 104 may be formed from tungsten (W), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), or a combination thereof. In at least some embodiments, the word line 104 is formed from tungsten. The word line 104 may be formed in, on, or over a substrate (not shown) using conventional techniques, such as atomic layer deposition (ALD), chemical vapor deposition (CVD), plasma enhanced chemical vapor deposition (PECVD), low pressure chemical vapor deposition (LPCVD), physical vapor deposition (PVD), or other film deposition processes. PVD includes, but is not limited to, sputtering, evaporation, or ionized PVD. Such deposition techniques are known in the art and, therefore, are not described in detail herein.

The substrate may be in the form of a semiconductor substrate, a base semiconductor layer on a supporting structure, a metal electrode, or a semiconductor substrate having one or more layers, structures, or regions formed thereon. The substrate may be a conventional silicon substrate or other bulk substrate including a layer of semiconductive material. The substrate may include, but is not limited to, silicon, silicon-on-insulator ("SOI") substrates, silicon-on-sapphire ("SOS") substrates, and silicon-on-glass ("SOG"), epitaxial silicon on a base semiconductor foundation, or another semiconductor or optoelectronic material, such as silicon-germanium, germanium, gallium arsenide, gallium nitride, and indium phosphide. The substrate may be doped or undoped.

The first electrode 106 may be formed from a conductive material with a sufficiently high melting point such that the first electrode 106 does not melt during normal operation of the memory cell 101. As used herein, a material with a high melting point means and includes a material with a melting point above about 1,800° C. Conventional memory cells may require that the electrode be substantially non-reactive with the threshold switching material 110. However, in embodiments of the present disclosure, since the dielectric material (e.g., the first dielectric material 108 and the second dielectric material 112) is positioned between the threshold switching material 110 and at least one of the first electrode 106 and the second electrode 114, reactions between the electrodes and the threshold switching material 110 may be reduced or eliminated. Thus, the material of the first electrode 106 may be reactive or substantially inert (e.g., non-reactive) with the threshold switching material 110. Accordingly, the first and second electrodes 106, 114 may be formed from a broader range of materials compared to conventional memory cells.

The first electrode 106 may be formed from a conductive carbon-containing material. For example, the first electrode 106 may be formed from carbon (C) atoms, a compound including carbon atoms, such as a carbon nitride, titanium carbon nitride ($TiC_xN_y$), tantalum carbon nitride ($TaC_xN_y$), titanium silicon carbon nitride ($TiSiC_xN_y$), titanium aluminum carbon nitride ($TiAlC_xN_y$), titanium silicon aluminum carbon nitride (TiSiAlC$_x$N$_y$), tungsten carbon nitride (WC$_x$N$_y$), tantalum carbon oxynitride (TaCO$_x$N$_y$), and tungsten silicon carbon nitride (WSiC$_x$N$_y$)), a carbon-containing metal silicide, tungsten, titanium, platinum, ruthenium, ruthenium oxide (RuO$_x$), metal nitrides (such as tungsten nitride (WN$_x$), titanium nitride (TiN$_x$), tantalum nitride (TaN$_x$), titanium aluminum nitride (TiAl$_x$N$_y$)), and combinations thereof, wherein x is between about 0 and about 6.0 and y is between about 0 and about 6.0. In some embodiments, the first electrode 106 includes a conductive carbon-containing material with a high melting point and a threshold voltage that is similar to a threshold voltage of the threshold switching material 110. In some embodiments, the first electrode 106 is a carbon electrode.

The first electrode 106 may be configured to conduct current to the threshold switching material 110. The thickness of the first electrode 106 may be selected at least partially based on material characteristics of one or more other components of the memory cell 101 (e.g., the memory material 116, the second electrode 114, the threshold switching material 110, etc.). For example, the thickness of the first electrode 106 may enable a threshold voltage of the first electrode 106 (e.g., a voltage at which the first electrode 106 functions as a low resistance conductor) to be substantially close to a threshold voltage of the threshold switching material 110 (described below). The thickness of the first electrode 106 may be between about 30 Å and about 2,000 Å, such as between about 100 Å and about 1,500 Å. In some embodiments, the thickness of the first electrode is about 200 Å.

The first electrode 106 may be formed on the word line 104 by conventional techniques including, but not limited to, ALD, CVD, PECVD, LPCVD, and PVD. In one embodiment, the first electrode 106 is formed by PVD, so that the first electrode 106 has high film quality, as well as high thermal compatibility with the threshold switching material 110. By way of non-limiting example, a carbon source, such as graphite, and in some embodiments, a source of an optional material to be co-sputtered with the carbon may be provided in a deposition chamber (not shown), such as a PVD chamber. The PVD chamber may be configured to generate a plasma including a noble gas element (e.g., helium, neon, argon, krypton, xenon, or radon). In at least one embodiment, the plasma includes argon. As the carbon source and the source of the optional material are bombarded with the plasma, carbon atoms and atoms of the optional material are sputtered from a surface of the sources and formed on a surface of the word line 104. A desired thickness of the first electrode 106 may be achieved by controlling a deposition time and an amount of power used.

The first dielectric material 108 may be formed over the first electrode 106 and located between the first electrode 106 and the threshold switching material 110 to reduce or prevent the threshold switching material 110 from reacting with the first electrode 106. The first dielectric material 108 may hinder elements of the threshold switching material 110 from diffusing into the first electrode 106 and may also hinder elements of the first electrode 106 from diffusing into the threshold switching material 110. Thus, the memory cell 101 may include a dielectric material on at least one side of the threshold switching material 110. The first dielectric material 108 may be between the threshold switching material 110 and the first electrode 106. In some embodiments, the first dielectric material 108 is formed over and in contact with a metal material of the first electrode 106.

The first dielectric material 108 may be formed between (e.g., intervene between) the first electrode 106 and the threshold switching material 110. The first dielectric material 108 may directly contact each of the first electrode 106 and the threshold switching material 110. In some embodiments, the first dielectric material 108 is in direct contact with the threshold switching material 110 and another material (not shown) intervenes between the first dielectric material 108 and the first electrode 106.

The first dielectric material 108 may form a distinct boundary between the first electrode 106 and the first dielectric material 108 and a distinct boundary between the first dielectric material 108 and the threshold switching material 110, providing a reduced number of electrical defects at interfaces of the threshold switching material 110 with other materials as compared to conventional memory cells.

The first dielectric material 108 may include any dielectric material with a high melting point that is chemically unreactive with each of the threshold switching material 110 and the first electrode 106. The first dielectric material 108 may include high-k metal oxides such as refractory metal oxides, an oxynitride such as SiO$_x$N$_y$, wherein x is between about 1 and about 4 and y is between about 1 and about 4, aluminum oxynitride (AlO$_x$N$_y$, wherein x is between about 0 and about 1.0 and y is between about 0 and about 1.0), nitrides (e.g., silicon nitride, aluminum nitride, hafnium nitride, zirconium nitride, etc.), carbon oxynitride (CN$_x$O$_y$, wherein x is between about 0 about 1.0 and y is between about 0 and about 1.0), and combinations thereof.

By way of non-limiting example, the first dielectric material 108 may include aluminum oxide (AlO$_x$), a compound including aluminum, silicon, and oxygen (aluminum silicon oxide (AlSi$_x$O$_y$)), magnesium oxide (MgO$_x$), strontium oxide (SrO), barium oxide (BaO), lanthanum oxide (LaO$_x$), lutetium oxide (LuO$_x$), dysprosium scandium oxide (DyS$c_y$O$_x$), strontium titanium oxide (SrTiO$_3$, also known as STO), aluminum oxynitride (AlO$_x$N$_y$), a refractory metal oxide, such as hafnium oxide (HfO$_x$), iridium oxide (IrO$_x$), titanium oxide (TiO$_x$), tantalum oxide (Ta$_x$O$_5$, such as Ta$_2$O$_5$), zirconium oxide (ZrO$_2$), niobium oxide (Nb$_x$O$_y$, such as NbO, NbO$_2$, or Nb$_2$O$_5$), molybdenum oxide, a refractory metal alloy oxide, such as hafnium oxynitride (HfO$_x$N$_y$) and hafnium silicon oxide (HfSi$_x$O$_y$), and combinations thereof, wherein x is between about 0 and about 6.0 and y is between about 0 and about 6.0. As used herein, the term "refractory metal alloy oxide" means and includes a compound including a refractory metal, oxygen, and at least one other element. The at least one other element may be another refractory metal. Other high-k dielectric materials may be utilized depending on the end use of the semiconductor device. In some embodiments, the first dielectric material 108 is an aluminum oxide, such as Al$_2$O$_3$. In other embodiments, the first dielectric material 108 includes more than one dielectric material, such as a first portion of a high-k dielectric material and a second portion of another high-k dielectric material.

The first dielectric material 108 may, optionally, be doped with components such as oxygen, sulfur, carbon, fluorine, metallic elements (e.g., transition metals), and combinations thereof. In some embodiments, the first dielectric material 108 is doped with at least one of silver, nickel, gallium, germanium, arsenic, indium, tin, antimony, gold, lead, bismuth, tantalum, zirconium, hafnium, and niobium. The concentration of the dopant in the first dielectric material 108 may be higher or lower at the interface with the threshold switching material 110 than at the side opposite this interface. In some embodiments, the concentration of the dopant may be uniform within the first dielectric material

108. However, the first dielectric material 108 may include a gradient of the dopant, such as at least a portion that is doped and another portion that is undoped.

A thickness of the first dielectric material 108 may be sufficient to cover exposed portions of the first electrode 106. However, the thickness of the first dielectric material 108 may not be so thick that the first dielectric material 108 exhibits tunneling characteristics. The first dielectric material 108 may be substantially continuous between the first electrode 106 and the threshold switching material 110 such that the first electrode 106 does not physically contact the threshold switching material 110. Thus, the first dielectric material 108 may physically isolate the first electrode 106 from the threshold switching material 110. However, the first dielectric material 108 may be discontinuous as long as the first electrode 106 does not physically contact the threshold switching material 110. The thickness of the first dielectric material 108 may be between about 3 Å and about 50 Å, such as between about 3 Å and about 5 Å, between about 5 Å and about 10 Å, between about 10 Å and about 20 Å, between about 20 Å and about 30 Å, or between about 30 Å and about 50 Å. In some embodiments, the thickness of the first dielectric material 108 is 10 Å. In some embodiments, the first dielectric material 108 includes only one monolayer of the first dielectric material 108.

The first dielectric material 108 may be formed using conventional techniques, such as ALD, CVD, PECVD, LPCVD, PVD, or other film deposition processes, which are not described herein. In some embodiments, the first dielectric material 108 is formed by ALD.

The threshold switching material 110 may be formed from any known material configured to be reversibly electrically switched (i.e., configured to reversibly electrically switch or change) from a relatively resistive state to a relatively conductive state and having substantially no tendency to undergo a structural or phase change under normal operating conditions of the memory cell 101. For example, subjecting the threshold switching material 110 to a voltage above a critical threshold level may switch or change the threshold switching material 110 from the relatively resistive state to the relatively conductive state. The relatively conductive state may continue until a current passing through the threshold switching material 110 drops below a critical holding level, at which time the threshold switching material 110 may switch or change to the relatively resistive state. When in the relatively resistive state, the threshold switching material 110 may be configured to impair or prevent residual voltages from word lines 104 and digit lines 120 associated with another memory cell 101 from affecting the physical state of the memory cell 101 associated with the threshold switching material 110.

By way of non-limiting example, the threshold switching material 110 may be a chalcogenide compound. As used herein, the term "chalcogenide compound" refers to a binary or multinary compound that includes at least one chalcogen atom and at least one more electropositive element or radical. As used herein, the term "chalcogen" refers to an element of Group VI of the Periodic Table, such as oxygen (O), sulfur (S), selenium (Se), tellurium (Te), or polonium (Po). The electropositive element may include, but is not limited to, nitrogen (N), silicon (Si), nickel (Ni), gallium (Ga), germanium (Ge), arsenic (As), silver (Ag), indium (In), tin (Sn), antimony (Sb), gold (Au), lead (Pb), bismuth (Bi), or combinations thereof. The chalcogenide compound may be a binary, ternary alloy, quaternary, quinary, senary, or a septenary alloy.

By way of non-limiting example, the threshold switching material 110 may be a chalcogenide compound including the chalcogen and the electropositive element. The chalcogen may be at least one of O, S, Se, Te, or Po. The electropositive element may include, but is not limited to, N, Si, Ni, Ga, Ge, As, Ag, In, Cd, Zn, Sn, Sb, Au, Pb, Bi, Cr, Nb, Pd, Pt, or combinations thereof. Non-limiting examples of chalcogenide compounds suitable for use as the threshold switching material 110 include Si, As, Se compounds; As and Te compounds, such as $As_2Te_3$; As and Se compounds, such as $As_2Se_3$; As, Te, and Ge compounds, such as $As_{30}Te_{45}Ge_{25}$; As, Se, and Ge compounds, such as $As_{28}Se_{42}Ge_{30}$; As, S, Se, and Ge compounds, such as $As_{30}S_{12}Se_{33}Ge_{25}$; and As, Te, Ge, Si, and In compounds, such as $As_{37}Te_{39}Ge_9Si_{14}In$. In at least some embodiments, the threshold switching material 110 is $As_{37}Te_{39}Ge_9Si_{14}In$. In other embodiments, the threshold switching material 110 includes arsenic, selenium, silicon, and germanium.

The threshold switching material 110 may be formed over the first electrode 106 and may be disposed between the first electrode 106 and the second electrode 114. The threshold switching material 110 may be formed using conventional techniques, such as ALD, CVD, PECVD, LPCVD, and PVD, which are not described in detail herein. The threshold switching material 110 may be formed at higher deposition temperatures (e.g., up to approximately 400° C.) without reacting with the first electrode 106 because of the presence of the first dielectric material 108. The threshold switching material 110 may be formed over the first electrode 106 without reacting with the first electrode 106 because the first dielectric material 108 may form a barrier between the threshold switching material 110 and the first electrode 106.

The second dielectric material 112 may overlie the threshold switching material 110. The second dielectric material 112 may be formed between (e.g., intervene between) the threshold switching material 110 and the second electrode 114. The second dielectric material 112 may directly contact each of the threshold switching material 110 and the second electrode 114. In some embodiments, the second dielectric material 112 is in direct contact with the threshold switching material 110 and another material (not shown) intervenes between the second dielectric material 112 and the second electrode 114.

The second dielectric material 112 may reduce or prevent interactions between the threshold switching material 110 and the second electrode 114. The second dielectric material 112 may act as a diffusion barrier and may reduce diffusion of elements of the threshold switching material 110 into the second electrode 114 and may also reduce diffusion of elements of the second electrode 114 into the threshold switching material 110.

The second dielectric material 112 may be formed from any dielectric material with a high melting point that is chemically unreactive with each of the threshold switching material 110 and the second electrode 114. The second dielectric material 112 may be formed from one of the materials described above for the first dielectric material 108. The second dielectric material 112 may be formed from the same material as the first dielectric material 108 or may be formed from a different material. In some embodiments, the second dielectric material 112 includes a dielectric material that is different than the first dielectric material 108. In some embodiments, the second dielectric material 112 includes an aluminum oxide, such as $Al_2O_3$.

The second dielectric material 112 may form a distinct boundary between the threshold switching material 110 and the second dielectric material 112 and a distinct boundary between the second dielectric material 112 and the second electrode 114, resulting in a reduced number of electrical defects at interfaces of the threshold switching material 110 with other materials as compared to conventional memory cells.

The second dielectric material 112 may, optionally, be doped with components such as oxygen, sulfur, carbon, fluorine, metallic elements (e.g., transition metals), and combinations thereof, similar to the dopants of the first dielectric material 108, as described above.

A thickness of the second dielectric material 112 may be sufficient to cover exposed portions of the threshold switching material 110. However, the thickness of the second dielectric material 112 may not be so thick that the second dielectric material 112 exhibits tunneling characteristics. The second dielectric material 112 may be substantially continuous between the threshold switching material 110 and the second electrode 114 such that the threshold switching material 110 does not physically contact the second electrode 114. Thus, the second dielectric material 112 may physically isolate the threshold switching material 110 from the second electrode 114. However, the second dielectric material 112 may be discontinuous as long as the threshold switching material 110 does not physically contact the second electrode 114. The thickness of the second dielectric material 112 may be between about 3 Å and about 50 Å, such as between about 3 Å and about 5 Å, between about 5 Å and about 10 Å, between about 10 Å and about 20 Å, between about 20 Å and about 30 Å, or between about 30 Å and about 50 Å. In some embodiments, the thickness of the second dielectric material 112 is 10 Å. The thickness of the second dielectric material 112 may be greater than, less than, or equal to the thickness of the first dielectric material 108. In some embodiments, the second dielectric material 112 includes only one monolayer of the second dielectric material 112.

The second dielectric material 112 may be formed using conventional techniques, such as ALD, CVD, PECVD, LPCVD, PVD, or other film deposition processes, which are not described herein. In some embodiments, the second dielectric material 112 is formed by ALD. The second electrode 114 may be formed over the second dielectric material 112 at higher deposition temperatures (e.g., up to approximately 400° C.) without reacting with the threshold switching material 110 because of the presence of the second dielectric material 112.

Each of the first dielectric material 108 and the second dielectric material 112 may be formed between an electrode and the threshold switching material 110. The first dielectric material 108 and the second dielectric material 112 may be formed in a direction perpendicular to a direction of current flow through the memory cell 101. For example, current may flow through the memory cell 101 between the word line 104 and the digit line 120. The first dielectric material 108 and the second dielectric material 112 may be perpendicular to the direction of current flow.

Thus, forming the memory cell 101 may include forming the first dielectric material 108 over the first electrode 106, forming the threshold switching material 110 over the first dielectric material 108, and forming the second dielectric material 112 between the threshold switching material 110 and the second electrode 114.

The second electrode 114 may overlie the second dielectric material 112. In some embodiments, the second electrode 114 directly overlies and contacts the second dielectric material 112. The second electrode 114 may be configured to conduct current to the memory material 116. The second electrode 114 may be formed from the same materials or from different materials as the first electrode 106. The second electrode 114 may be formed from one of the materials described above for the first electrode 106. The second electrode 114 may include a carbon material or a conductive carbon-containing material. For example, the second electrode 114 may include a compound having carbon atoms, a carbon nitride, a carbon-containing metal silicide, a metal, or a metal nitride, as described above with reference to the first electrode 106. By way of non-limiting example, the second electrode may include $TiC_xN_y$, $TaC_xN_y$, $TiSiC_xN_y$, $TiAlC_xN_y$, $TiSiAlC_xN_y$, $WC_xN_y$, $TaCO_xN_y$, $WSiC_xN_y$, W, Ti, Pt, Ru, $RuO_x$, $WN_x$, $TiN_x$, $TaN_x$, $TiAl_xN_y$, and combinations thereof, wherein x is between about 0 and about 6.0 and y is between about 0 and about 6.0. In some embodiments, the second electrode 114 includes the same material as the first electrode 106. In some embodiments, the second electrode 114 is a carbon electrode.

Similar to the first electrode 106 previously described, a thickness of the second electrode 114 may be selected at least partially based on material characteristics of at least one other component of the memory cell 101. For example, the thickness of the second electrode 114 may enable a threshold voltage of the second electrode 114 (e.g., a voltage at which the second electrode 114 functions as a low resistance conductor) to be substantially close to a threshold voltage of the memory material 116. The thickness of the second electrode 114 may be between about 30 Å and about 2,000 Å, such as between about 100 Å and about 1,500 Å. In at least some embodiments, the thickness of the second electrode 114 is about 2,000 Å. The thickness of the second electrode 114 may be greater than, less than, or equal to the thickness of the first electrode 106.

The second electrode 114 may be formed by conventional techniques including, but not limited to, ALD, CVD, PECVD, LPCVD, or PVD. The second electrode 114 may be formed in a manner substantially similar to that described above with respect to forming the first electrode 106.

The memory material 116 may be any known material (e.g., a programmable material) configured to be electrically switched or changed (i.e., configured to reversibly electrically switch or change) between a first phase and a second phase, where the first phase and the second phase differ in at least one detectable (e.g., measurable) property (e.g., electrical resistivity, electrical conductivity, optical transmissivity, optical absorption, optical refraction, optical reflectivity, morphology, surface topography, relative degree of order, relative degree of disorder, or combinations thereof). For example, each physical state of the memory material 116 may exhibit a particular resistance that may be used to distinguish logic values of the memory cell 101.

The memory material 116 may be formed between the second electrode 114 and the third electrode 118. The memory material 116 may include a storage material suitable for a resistive-type memory cell (RRAM), such as a dynamic random-access memory (DRAM) cell, a phase-change RAM (PCRAM) cell, a conductive-bridge RAM cell, a ferroelectric RAM (FRAM) cell, and a spin-transfer torque RAM (STTRAM) cell. The memory material 116 may include a transition metal oxide, transition metals, alkaline earth metals, rare earth metals, and combinations thereof. Other memory materials 116 may include chalcogenides, binary metal oxides, colossal magnetoresistive materials, polymer-based resistive materials, and combinations thereof. In some embodiments, the memory material 116 is a compound including a chalcogenide and the threshold switching material 110 is a different compound including the same or different chalcogenides than the memory material 116.

The memory material 116 may be formed over the second electrode 114. The memory material 116 may be formed using conventional techniques, such as ALD, CVD, PECVD, LPCVD, and PVD, which are not described in detail herein.

The third electrode 118 may overlie the memory material 116. The third electrode 118 may directly overlie and contact the memory material 116 and may be configured to conduct current to the digit line 120 overlying the third electrode 118. The third electrode 118 may be formed from one of the materials described above for the first electrode 106 and the second electrode 114. By way of example only, the third electrode 118 may be formed from a compound having carbon atoms, a carbon nitride, a carbon containing metal silicide, a metal, or a metal nitride, as described above with reference to the first electrode 106 and the second electrode 114. By way of non-limiting example, the second electrode may include $TiC_xN_y$, $TaC_xN_y$, $TiSiC_xN_y$, $TiAlC_xN_y$, $TiSiAl-C_xN_y$, $WC_xN_y$, $TaCO_xN_y$, $WSiC_xN_y$, W, Ti, Pt, Ru, $RuO_x$, $WN_x$, $TiN_x$, $TaN_x$, $TiAl_xN_y$, and combinations thereof, wherein x is between about 0 and about 6.0 and y is between about 0 and about 6.0. In some embodiments, the third electrode 118 is formed from the same material as at least one of the first electrode 106 and the second electrode 114. In some embodiments, the third electrode 118 is a carbon electrode.

Similar to the first electrode 106 and the second electrode 114 previously described, a thickness of the third electrode 118 may be selected at least partially based on material characteristics of at least one other component of the memory cell 101. For example, the thickness of the third electrode 118 may enable a threshold voltage of the third electrode 118 (e.g., a voltage at which the third electrode 118 functions as a low resistance conductor) to be substantially close to a threshold voltage of the digit line 120. The thickness of the third electrode 118 may be between about 30 Å and about 2,000 Å, such as between about 100 Å and about 1,500 Å. In at least some embodiments, the thickness of the third electrode 118 is about 2,000 Å. The thickness of the third electrode 118 may be greater than, less than, or equal to the thickness of the first electrode 106 or the thickness of the second electrode 114.

The third electrode 118 may be formed by conventional techniques including, but not limited to, ALD, CVD, PECVD, LPCVD, or PVD. The third electrode 118 may be formed in a manner substantially similar to that described above with respect to forming the first electrode 106 and the second electrode 114.

The digit line 120 may be formed from any suitable conductive material including, but not limited to, a metal, a metal alloy, a conductive metal oxide, or combinations thereof. By way of non-limiting example, the digit line 120 may be formed from W, WN, Ni, TaN, Pt, Au, TiN, TiSiN, TiAlN, or MoN. The digit line 120 may be formed from substantially the same material as the word line 104 or may be formed from a different material than the word line 104. In at least some embodiments, the digit line 120 is formed from tungsten. The digit line 120 may be formed on the third electrode 118 using conventional techniques, such as ALD, CVD, PECVD, LPCVD, or PVD, which are not described in detail herein.

Figure 1B:
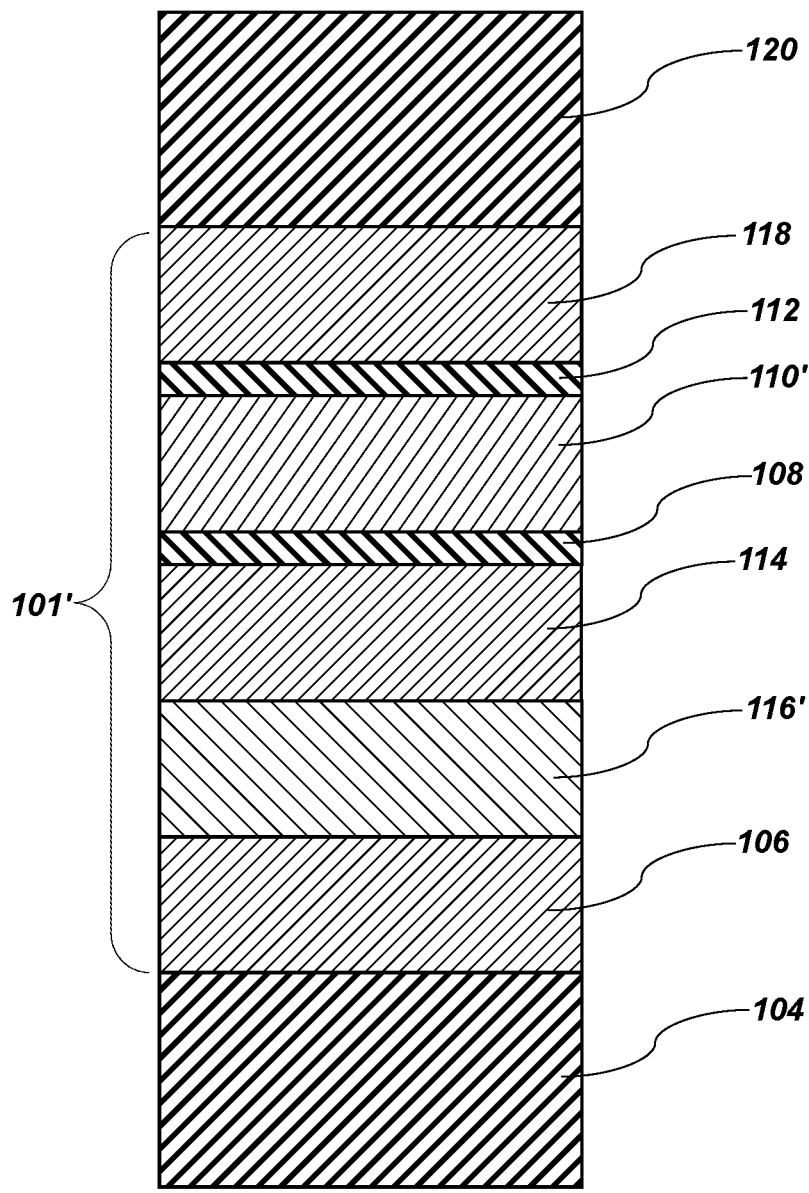

In further embodiments, relative positions of the threshold switching material 110 and the memory material 116 may be different than described above. For example, referring to FIG. 1B, a memory cell 101' may include each component of memory cell 101 (FIG. 1A) previously described, except that the relative positions of the threshold switching material 110' and the memory material 116' may be switched (e.g., reversed). Thus, the memory cell 101' may include, from bottom to top, the first electrode 106, the memory material 116', the second electrode 114, the first dielectric material 108, the threshold switching material 110', the second dielectric material 112, and the third electrode 118. The first electrode 106 may be formed on the word line 104, the memory material 116' may be formed on the first electrode 106, the second electrode 114 may be formed on the memory material 116', the first dielectric material 108 may be formed on the second electrode 114, the threshold switching material 110' may be formed on the first dielectric material 108, the second dielectric material 112 may be formed on the threshold switching material 110', and the third electrode 118 may be formed on the second dielectric material 112.

Accordingly, a memory cell is disclosed. The memory cell comprises a threshold switching material over a first electrode comprising carbon on a substrate, a second electrode over the threshold switching material, at least one dielectric material between the threshold switching material and at least one of the first electrode and the second electrode, and a memory material over the second electrode.

Accordingly, a method of forming a memory cell is disclosed. The method comprises forming a threshold switching material over a first electrode on a substrate, forming a second electrode over the threshold switching material, forming a dielectric material between the threshold switching material and at least one of the first electrode and the second electrode, and forming a memory material over the second electrode.

Figure 2A:
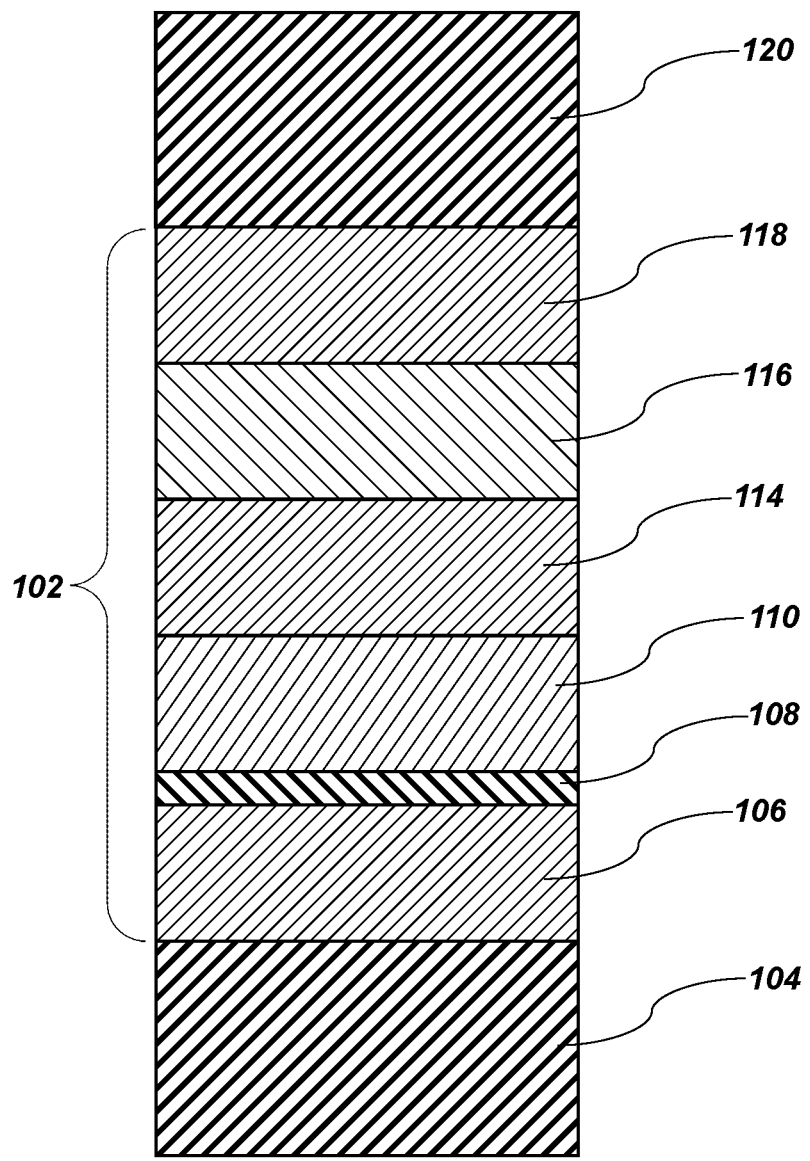
FIG. 2A and FIG. 2B are simplified cross-sectional views of a memory cell including a dielectric material on one side of a threshold switching material according to other embodiments of the present disclosure.
Figure 2B:
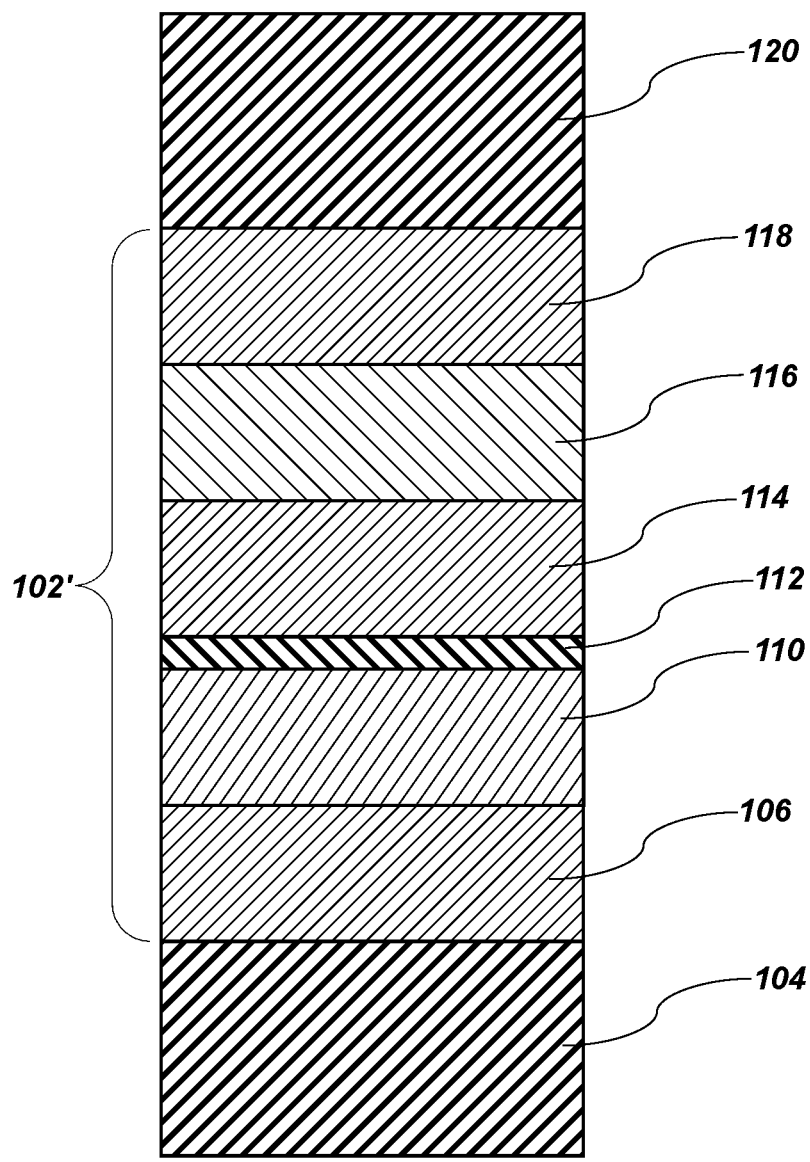

Referring to FIG. 2A and FIG. 2B, a memory cell 102, 102' may include components similar to components of the memory cell 101 (FIG. 1A) previously described, except that only one of the first dielectric material 108 and the second dielectric material 112 is present. The first dielectric material 108 or the second dielectric material 112 may be present on one side of the threshold switching material 110, such as between the threshold switching material 110 and the first electrode 106 or between the threshold switching material 110 and the second electrode 114.

Referring to FIG. 2A, the memory cell 102 includes the threshold switching material 110 between the first electrode 106 and the second electrode 114. The first dielectric material 108 may intervene between the first electrode 106 and the threshold switching material 110. The threshold switching material 110 may directly overlie and contact the first dielectric material 108. The second electrode 114 may directly overlie and contact the threshold switching material 110.

Referring to FIG. 2B, the memory cell 102' includes the threshold switching material 110 between the first electrode 106 and the second electrode 114. The threshold switching material 110 may directly overlie and contact the first electrode 106. The second dielectric material 112 may directly overlie and contact the threshold switching material 110. The second dielectric material 112 may intervene between the threshold switching material 110 and the second electrode 114.

The materials of the first electrode 106, the first dielectric material 108, the threshold switching material 110, the second electrode 114, the memory material 116, and the third electrode 118 may be substantially similar to those described above and may be formed in a substantially similar manner as described above.

Figure 3A:
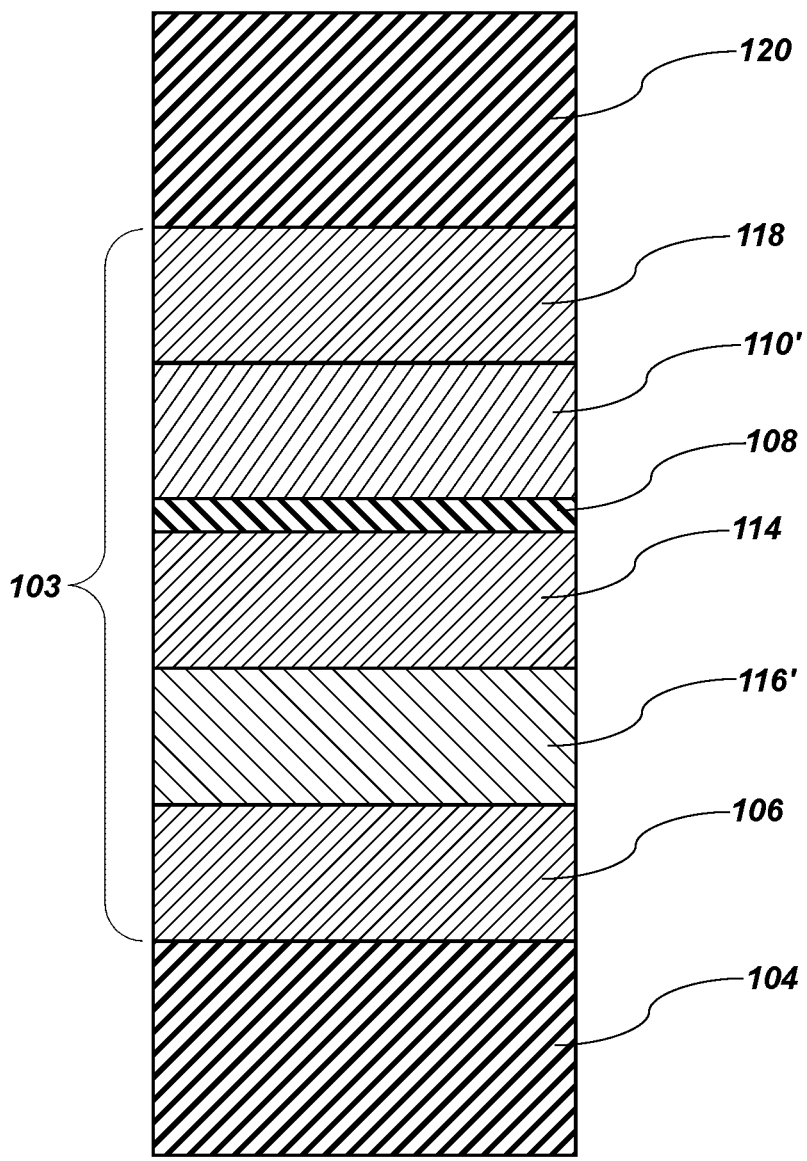
FIG. 3A and FIG. 3B are simplified cross-sectional views of another memory cell including a dielectric material on one side of a threshold switching material according to yet other embodiments of the present disclosure.

Referring to FIG. 3A, another embodiment of a memory cell 103 is shown. The memory cell 103 includes components similar to components of the memory cell 101' (FIG. 1B) previously described, except that the second dielectric material 112 is not present. Thus, the memory cell 103 includes, from bottom to top, the first electrode 106, the memory material 116', the second electrode 114, the first dielectric material 108, the threshold switching material 110', and the third electrode 118. The first dielectric material 108 intervenes between the second electrode 114 and the threshold switching material 110'. The first dielectric material 108 may directly overlie and contact the second electrode 114. The threshold switching material 110' may directly overlie and contact the first dielectric material 108. The third electrode 118 may directly overlie and contact the threshold switching material 110'.

Figure 3B:
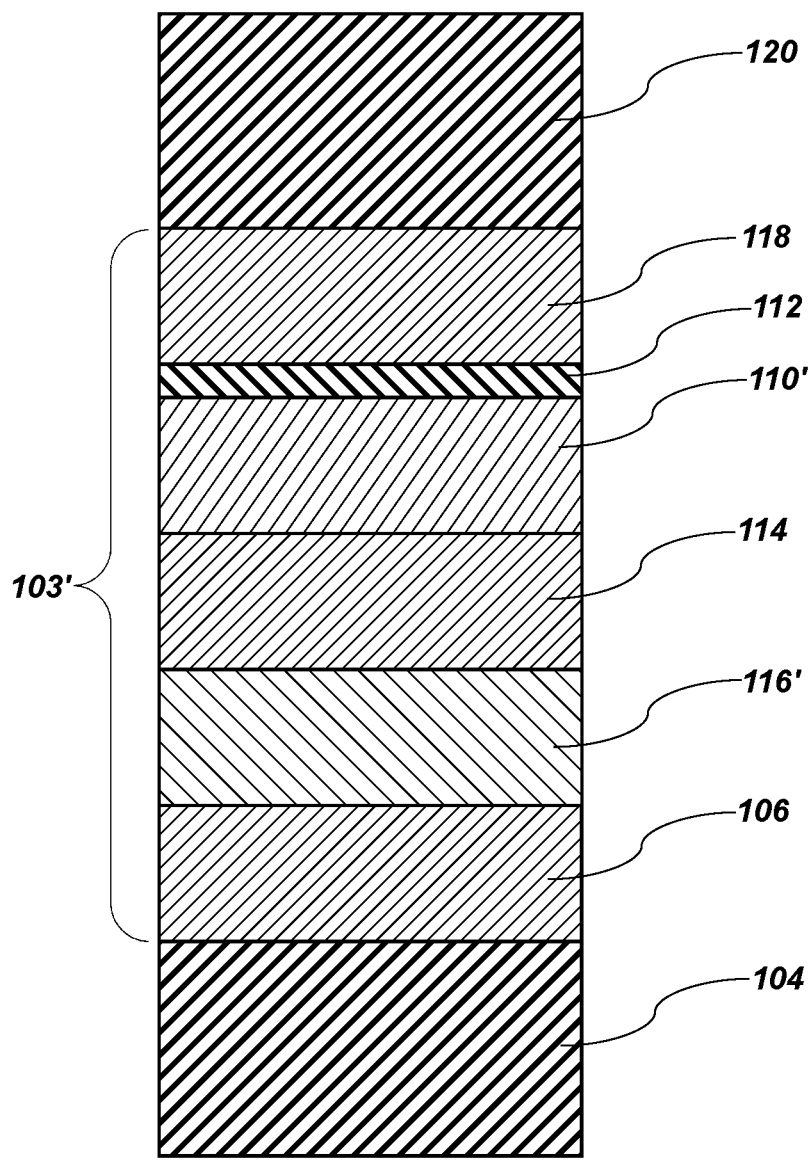

Referring to FIG. 3B, another embodiment of a memory cell 103' is shown. The memory cell 103' includes components similar to components of the memory cell 103 (FIG. 3A) previously described, except that the first dielectric material 108 (FIG. 3A) is not present and the second dielectric material 112 intervenes between the threshold switching material 110' and the third electrode 118. Thus, the memory cell 103' includes, from bottom to top, the first electrode 106, the memory material 116', the second electrode 114, the threshold switching material 110', the second dielectric material 112, and the third electrode 118. The threshold switching material 110' may directly overlie and contact the second electrode 114. The second dielectric material 112 may directly overlie and contact the threshold switching material 110'. The third electrode 118 may directly overlie and contact the second dielectric material 112.

Accordingly, a memory cell comprising one intervening dielectric material between an electrode and a threshold switching material is disclosed. The memory cell comprises a threshold switching material between a pair of electrodes, at least one dielectric material between the threshold switching material and at least one electrode of the pair of electrodes, and a memory material adjacent at least one of the electrodes of the pair of electrodes.

Figure 4:
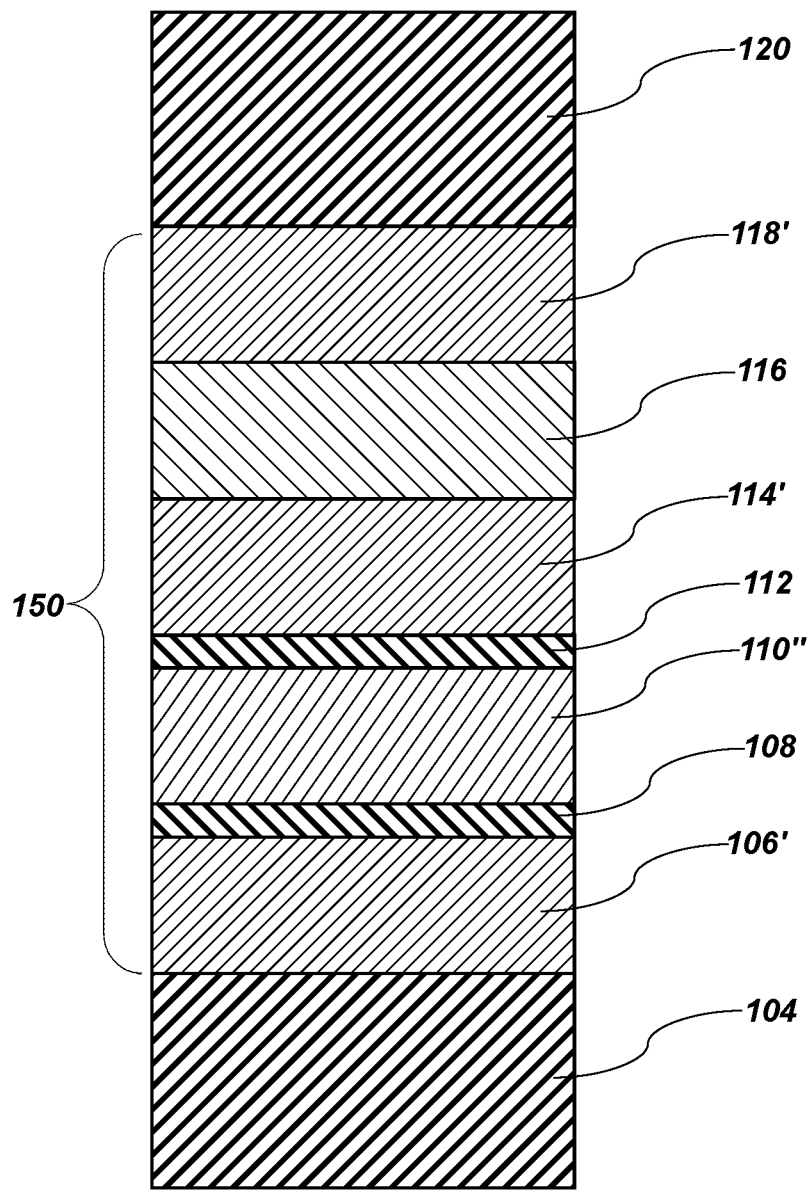
FIG. 4 is a simplified cross-sectional view of a memory cell including dielectric materials adjacent a threshold switching material according to some embodiments of the present disclosure.

Referring to FIG. 4, another embodiment of a memory cell 150 is shown. The memory cell 150 includes components similar to components of the memory cell 101 (FIG. 1A) previously described, except that first electrode 106', second electrode 114', third electrode 118', and threshold switching material 110" may be formed from different materials. Thus, the memory cell 150 includes, from bottom to top, the first electrode 106', the first dielectric material 108, the threshold switching material 110", the second dielectric material 112, the second electrode 114', the memory material 116, and the third electrode 118'.

The first electrode 106', the second electrode 114', and the third electrode 118' may each be formed of a conductive material. The electrodes may be formed from a metal, a metal silicide, or polysilicon. For example, the electrodes may be formed from polysilicon, tungsten, platinum, palladium, tantalum, nickel, titanium nitride, tantalum nitride, tungsten nitride, tungsten silicide ($WSi_x$), cobalt silicide ($CoSi_x$), tantalum silicide ($TaSi_x$), manganese silicide ($MnSi_x$), ruthenium silicide ($RuSi_x$), and nickel silicide ($NiSi_x$), (wherein x is a rational number greater than zero), or combinations thereof. In some embodiments, the first electrode 106', the second electrode 114', and the third electrode 118' are formed from a metal material. Each of the first electrode 106', the second electrode 114', and the third electrode 118' may be formed from the same material or different materials as at least one of the other of the first electrode 106', the second electrode 114', and the third electrode 118'. Each of the first electrode 106', the second electrode 114', and the third electrode 118' may be formed as described above with reference to the first electrode 106, the second electrode 114, and the third electrode 118 of FIG. 1A. The first electrode 106', the second electrode 114', and the third electrode 118' may be formed by conventional techniques including, but not limited to, ALD, CVD, PECVD, LPCVD, and PVD. The thickness of each of the first electrode 106', the second electrode 114', and the third electrode 118' may be between about 100 Å and about 2,000 Å, such as between about 300 Å and about 1,500 Å.

The threshold switching material 110" may be formed from amorphous silicon. The amorphous silicon may be substantially pure. The amorphous silicon may have a concentration of silicon between about 90 atomic percent and about 100 atomic percent. In some embodiments, the threshold switching material 110" is homogeneous and includes about 100 atomic percent amorphous silicon. The threshold switching material 110" may also include amorphous silicon doped with one or more materials. The threshold switching material 110" may include amorphous silicon doped with p-type dopants (e.g., boron atoms, aluminum atoms, or gallium atoms), or n-type dopants (e.g., phosphorus atoms or nitrogen atoms). In some embodiments, the amorphous silicon may be doped with dopants that increase a crystallization temperature of the amorphous silicon, such as at least one of carbon, oxygen, and nitrogen. In other embodiments, the threshold switching material 110" includes amorphous silicon and between about 1 atomic percent and about 30 atomic percent of at least one of carbon, oxygen, and nitrogen.

The threshold switching material 110" may be formed using conventional techniques, such as ALD, CVD, PECVD, LPCVD, or PVD, which are not described in detail herein.

The first dielectric material 108 may intervene between the first electrode 106' and the threshold switching material 110". The first dielectric material 108 may directly contact each of the first electrode 106' and the threshold switching material 110". The first dielectric material 108 may form a continuous material between the first electrode 106' and the threshold switching material 110" such that the first electrode 106' is physically isolated from the threshold switching material 110". However, the first dielectric material 108 may be discontinuous as long as the first electrode 106' does not physically contact the threshold switching material 110". In some embodiments, the first dielectric material 108 is in direct contact with the threshold switching material 110" and another material (not shown) intervenes between the first dielectric material 108 and the first electrode 106'. In some embodiments, the first dielectric material 108 is $TiO_2$.

The second dielectric material 112 may overlie the threshold switching material 110". The second dielectric material 112 may intervene between the threshold switching material 110" and the second electrode 114'. The second dielectric material 112 may directly contact each of the threshold switching material 110" and the second electrode 114'. The second dielectric material 112 may form a continuous material between the threshold switching material 110" and the second electrode 114' such that the threshold switching material 110" is physically isolated from the second electrode 114'. However, the second dielectric material 112 may be discontinuous as long as the second electrode 114' does not physically contact the threshold switching material 110". In some embodiments, the second dielectric material 112 is in direct contact with the threshold switching material 110"

and another material (not shown) intervenes between the second dielectric material 112 and the second electrode 114'. In some embodiments, the second dielectric material 112 is TiO$_2$.

Figure 5:
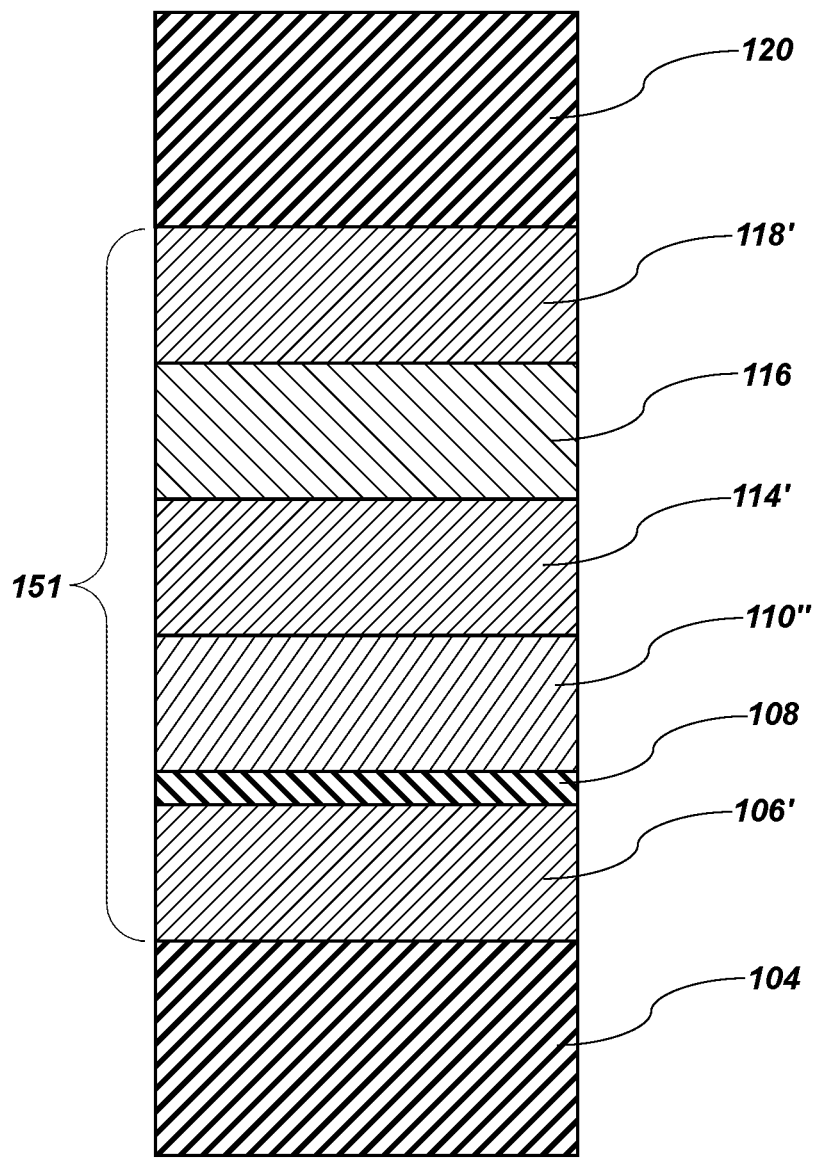
FIG. 5 is a simplified cross-sectional view of another memory cell including a dielectric material on one side of a threshold switching material according to other embodiments of the present disclosure.

Referring to FIG. 5, yet another embodiment of a memory cell 151 including a dielectric material in contact with one electrode and the threshold switching material 110" is shown. The memory cell 151 includes components similar to components of the memory cell 150 (FIG. 4) previously described, except that the second dielectric material 112 is not present. Thus, the memory cell 151 includes, from bottom to top, the first electrode 106', the first dielectric material 108, the threshold switching material 110", the second electrode 114', the memory material 116, and the third electrode 118'. The first dielectric material 108 intervenes between the first electrode 106' and the threshold switching material 110". The first dielectric material 108 may overlie the first electrode 106' and directly contact the threshold switching material 110".

Figure 6:
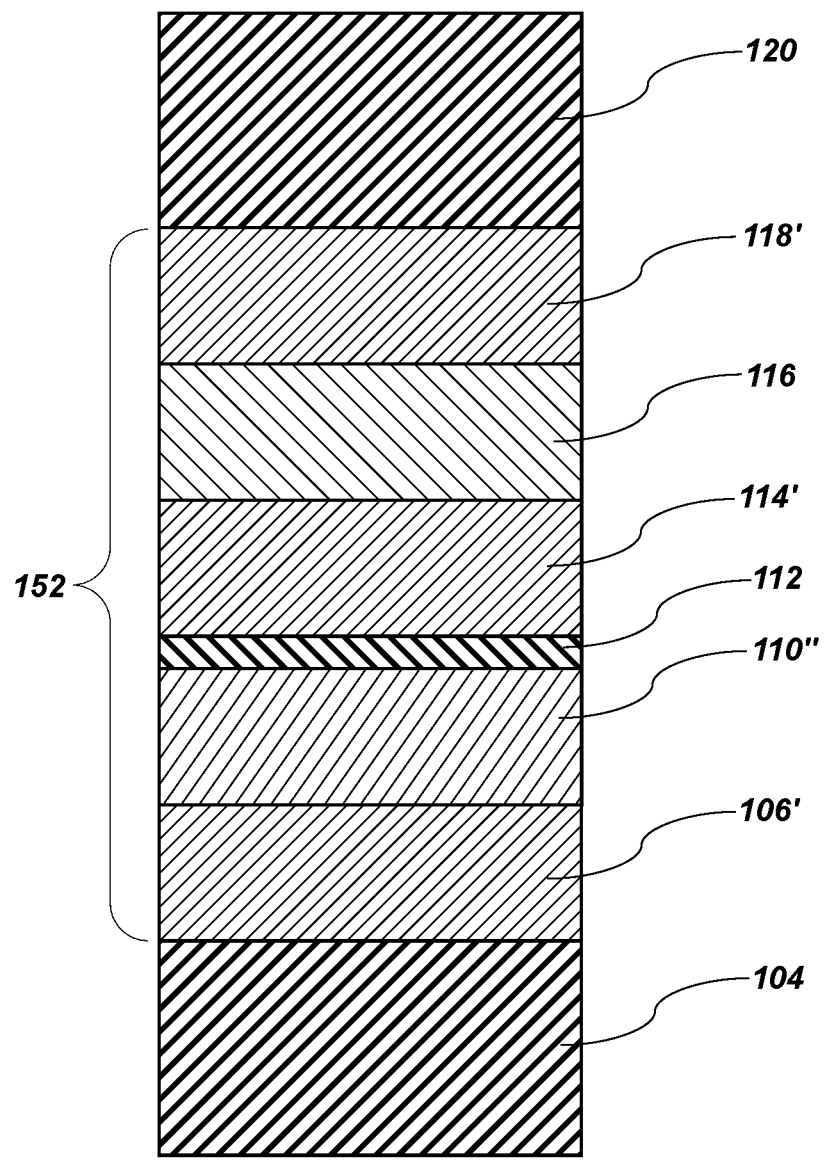
FIG. 6 is a simplified cross-sectional view of another memory cell including a dielectric material on one side of a threshold switching material according to yet other embodiments of the present disclosure.

Referring to FIG. 6, another embodiment of a memory cell 152 is shown. The memory cell 152 includes components similar to components of the memory cell 150 (FIG. 4) previously described, except that the first dielectric material 108 is not present. Thus, the memory cell 152 includes, from bottom to top, the first electrode 106', the threshold switching material 110", the second dielectric material 112, the second electrode 114', the memory material 116, and the third electrode 118'. The second dielectric material 112 intervenes between the threshold switching material 110" and the second electrode 114'. The second dielectric material 112 may directly overlie and contact the threshold switching material 110".

The materials of the first dielectric material 108, the second dielectric material 112, and the memory material 116 may be substantially similar to those described above and may be formed in a substantially similar manner as described above.

In further embodiments, relative positions of the threshold switching material 110" and the memory material 116 may be different than described above in each of FIG. 4 through FIG. 6. For example, in each of FIG. 4 through FIG. 6, the relative position of the threshold switching material 110" may be reversed with the position of the memory material 116. Each of the first dielectric material 108 and the second dielectric material 112 may remain in contact with the threshold switching material 110", as described above.

Figure 7:
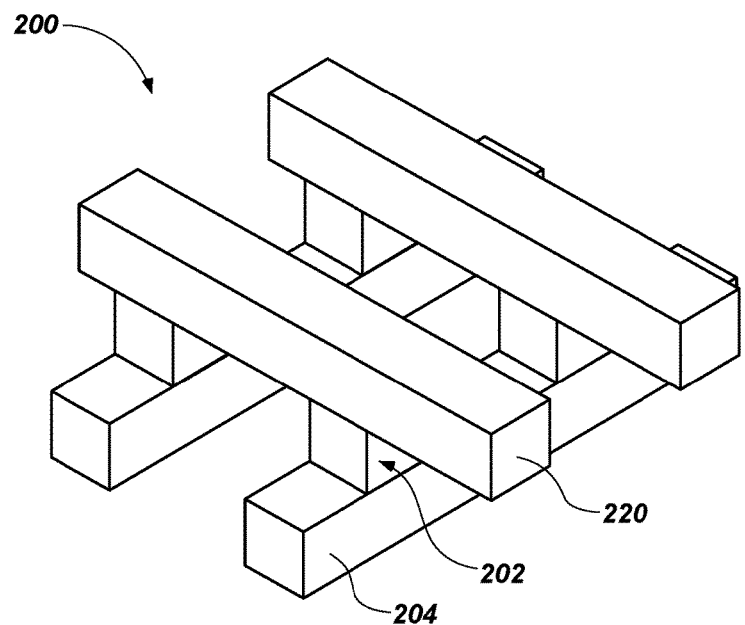
FIG. 7 is a perspective view of a memory cell array including a plurality of memory cells of the present disclosure.

Referring to FIG. 7, a memory array 200 including a plurality of memory cells 202 is shown. The memory cells 202 may be one of the memory cells 101, 101', 102, 102', 103, 103', 150, 151, 152 previously described. The plurality of memory cells 202 may be positioned between a plurality of word lines 204 and a plurality of digit lines 220. The plurality of word lines 204 may correspond to one of the word lines 104 previously described and the plurality of digit lines 220 may correspond to one of the digit lines 120 previously described. Each of the word lines 204 may extend in a first direction and may connect to a row of the memory cells 202. Each of the digit lines 220 may extend in a second direction at least substantially perpendicular to the first direction and may connect to a column of the memory cells 202. Each of the memory cells 202 may include a word line node (not shown) coupled to a respective word line 204, and a digit line node (not shown) coupled to a respective digit line 220. A voltage applied to the word lines 204 and the digit lines 220 may be controlled such that an electric field may be selectively applied to at least one word line 204 and to at least one digit line 220, enabling the memory cells 202 to be selectively operated. Accordingly, a memory device may be formed which includes the memory array 200.

Figure 8:
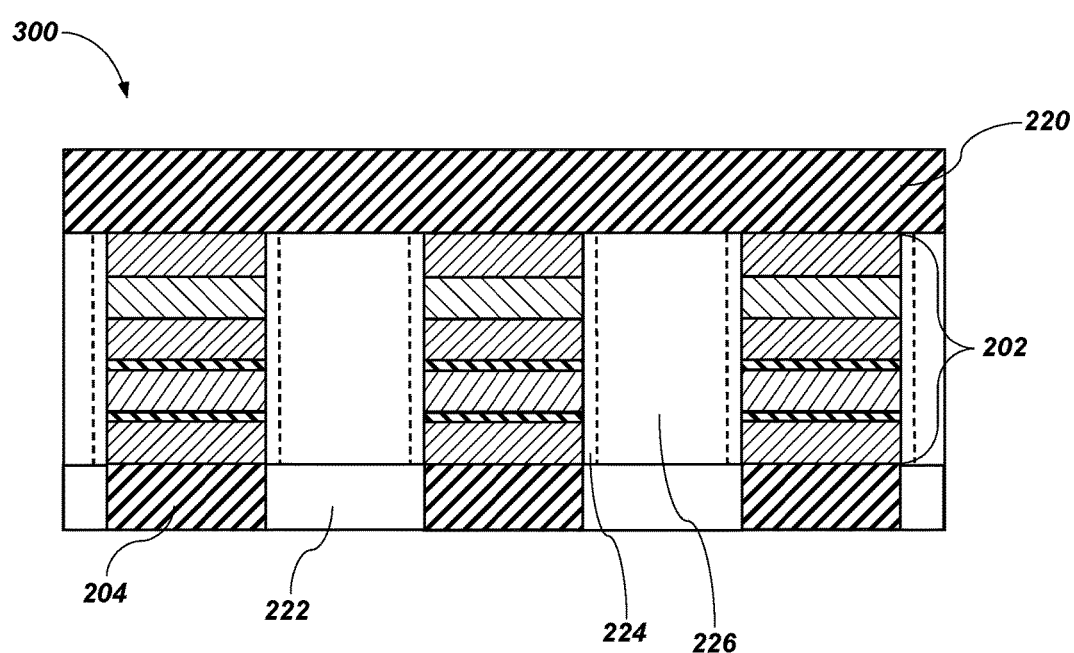
FIG. 8 is a cross-sectional view of a memory device in accordance with an embodiment of the present disclosure.

FIG. 8 illustrates a memory device 300 that includes the memory array 200 (FIG. 7) including the plurality of memory cells 202, the plurality of word lines 204, the plurality of digit lines 220, an insulator material 222, a first insulating dielectric material 224, and an optional second insulating dielectric material 226. Each of the insulator material 222, the first insulating dielectric material 224, and the optional second insulating dielectric material 226 may be a suitable insulative or dielectric material including, but not limited to, silicon oxide, silicon nitride, silicon oxynitride, a spin-on-glass (SOG), a phosphosilicate glass (PSG), tetraethyl orthosilicate (TEOS), or borophosilicate glass (BPSG). The memory device 300 may be formed by conventional techniques.

Accordingly, a memory device comprises word lines over a substrate, digit lines perpendicular to the word lines, and memory cells arranged in an array of rows and columns, each memory cell coupled to a respective word line and coupled to a respective digit line and comprising a threshold switching material over a first electrode on a substrate, a second electrode over the threshold switching material, a dielectric material between the threshold switching material and at least one of the first electrode and the second electrode, and a memory material over the second electrode.

Figure 9A:
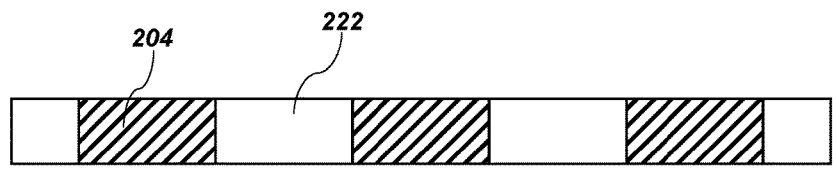
FIG. 9A through FIG. 9E are cross-sectional views illustrating different process stages for a method of forming the memory device of FIG. 8.
Figure 9B:
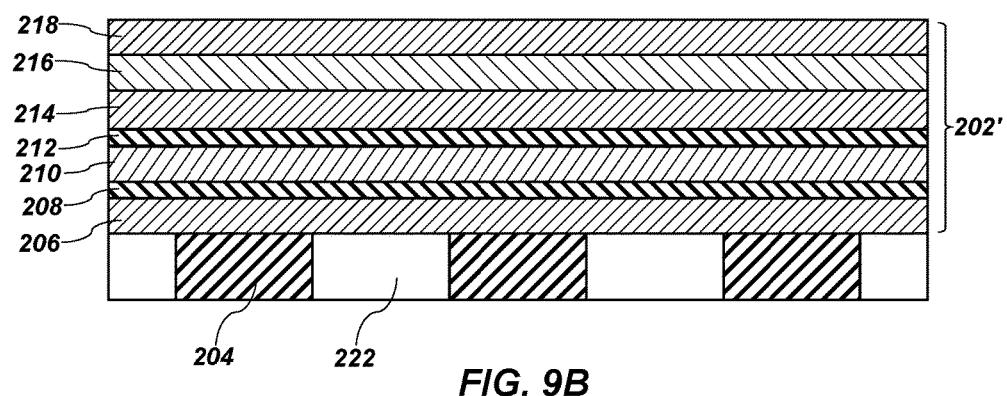
Figure 9C:
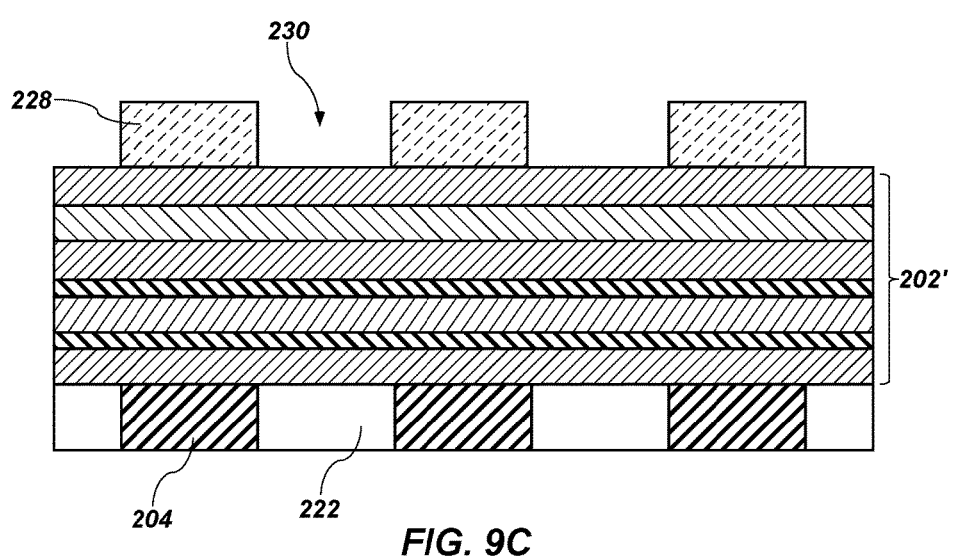
Figure 9D:
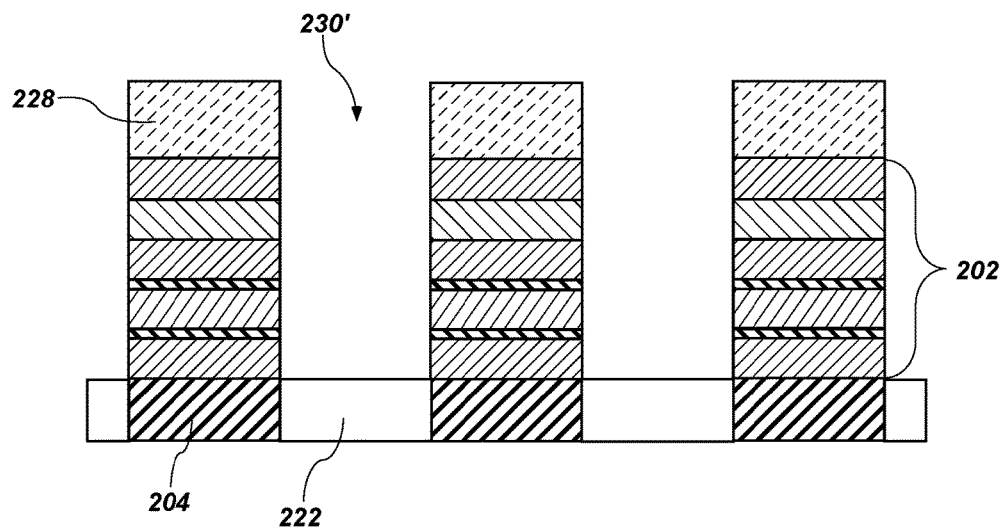
Figure 9E:
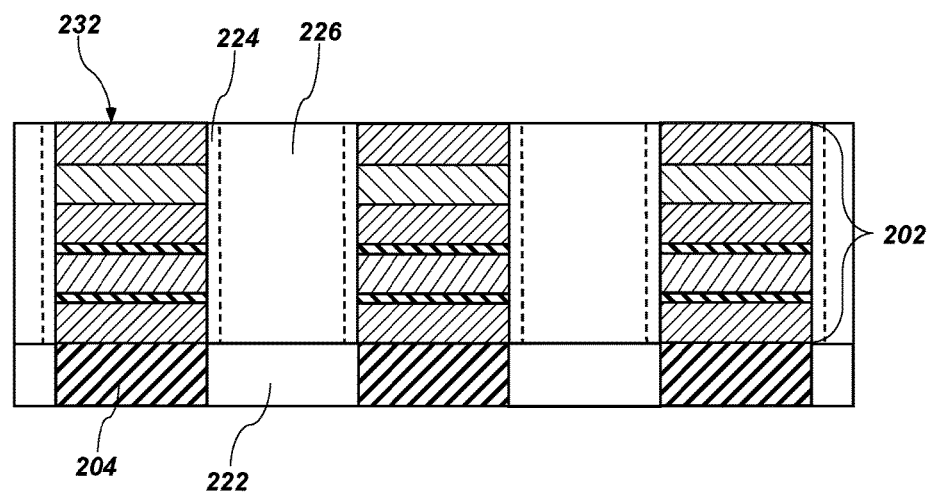

Referring to FIG. 9A through FIG. 9E, a method of forming the memory device 300 (FIG. 8) is described. By way of non-limiting example and as illustrated in FIG. 9A, the plurality of word lines 204 may be formed in the insulator material 222. As shown in FIG. 9B, a memory cell 202' may be formed on the plurality of word lines 204 and the insulator material 222 in a manner substantially similar to that previously described for one of the memory cells 101, 101', 102, 102', 103, 103', 150, 151, and 152. For example, a first electrode 206 may be formed over the word lines 204 and insulator material 222, a first dielectric material 208 may be formed over the first electrode 206, a threshold switching material 210 may be formed over the first dielectric material 208, a second dielectric material 212 may be formed over the threshold switching material 210, a middle electrode 214 may be formed over the second dielectric material 212, a memory material 216 may be formed over the middle electrode 214, and a third electrode 218 may be formed over the memory material 216. As illustrated in FIG. 9C, openings 230 may be formed in a hardmask 228 overlying the memory cell 202'. The openings 230 may be used as a mask to transfer a corresponding pattern into the memory cell 202' to form the plurality of memory cells 202 and the openings 230', as shown in FIG. 9D. Remaining portions of the hardmask 228 may be removed (e.g., by etching or chemical mechanical planarization). The first insulating dielectric material 224 may optionally be formed over the plurality of memory cells 202 and the plurality of openings 230' may be filled with the optional second insulating dielectric material 226. A portion of at least one of the first insulating dielectric material 224, the second insulating dielectric material 226, and the plurality of memory cells 202 may be removed (e.g., by chemical mechanical planarization) to form a substantially planar surface 232, as shown in FIG. 9E. The plurality of digit lines 220 may then be formed on the substantially planar surface 232 using conventional techniques to form the memory device 300 illustrated in FIG. 8.

In use and operation, the word lines 204 and the digit lines 220 of the memory device 300 are connected to circuitry (not shown) configured to program and read the memory device 300. Current delivered to the plurality of word lines 204 (e.g., by electrical contact with an interconnect) may flow through the plurality of memory cells 202, and to the plurality of digit lines 220. By way of non-limiting example and referring to FIG. 1A, if the plurality of memory cells 202 (FIG. 8) are the memory cells 101, described above, current from the plurality of word lines 204 may flow through the first electrode 106, the first dielectric material 108, the threshold switching material 110, the second dielectric material 112, the second electrode 114, the memory material 116, and the third electrode 118, to the digit lines 120 (FIG. 8). As the current passes through the memory material 116, at least one detectable property change (e.g., an electrical resistivity change, as described above) may occur and be utilized to distinguish logic values of the memory cell 101 as desired. If the plurality of memory cells 202 (FIG. 8) include one of the other memory cells 101', 102, 102', 103, 103', 150, 151, 152 the memory device 300 may be used and operated in a similar manner.

The memory cells 101, 101', 102, 102', 103, 103', 150, 151, 152 and memory device 300 advantageously reduce energy demands, increase memory lifespan, and decrease performance degradation issues as compared to conventional memory cells and devices. For example, the presence of at least one of the first dielectric material 108 and the second dielectric material 112 in the memory cells 101, 101', 102, 102', 103, 103', 150, 151, 152 and memory device 300 reduce electrical defects at the interface between the threshold switching material 110 and materials adjacent the threshold switching material 110, 110', 110". As a result, the memory cells exhibit a lower variability in contact resistance, and an associated lower variability in threshold voltage in each memory cell of the array. In addition, each memory cell exhibits a lower current leakage when the threshold switching material 110, 110', 110" is in the off state. Providing at least one of the first dielectric material 108 and the second dielectric material 112 on at least one of opposing sides of the threshold switching material 110, 110', 110" of the memory cells 101, 101', 102, 102', 103, 103', 150, 151, 152 may also increase the stability of the cells through a higher number of operation cycles as compared to conventional memory cells.

In addition, the presence of at least one of the first dielectric material 108 and the second dielectric material 112 enable a broader range of materials to be used as the electrodes of the memory cells 101, 101', 102, 102', 103, 103', 150, 151, 152. The electrodes may be selected based on the desired work function of the electrode, rather than selecting the material of the electrodes to be substantially nonreactive with the threshold switching material 110, 110', 110".

EXAMPLES

Example 1

Figure 10:
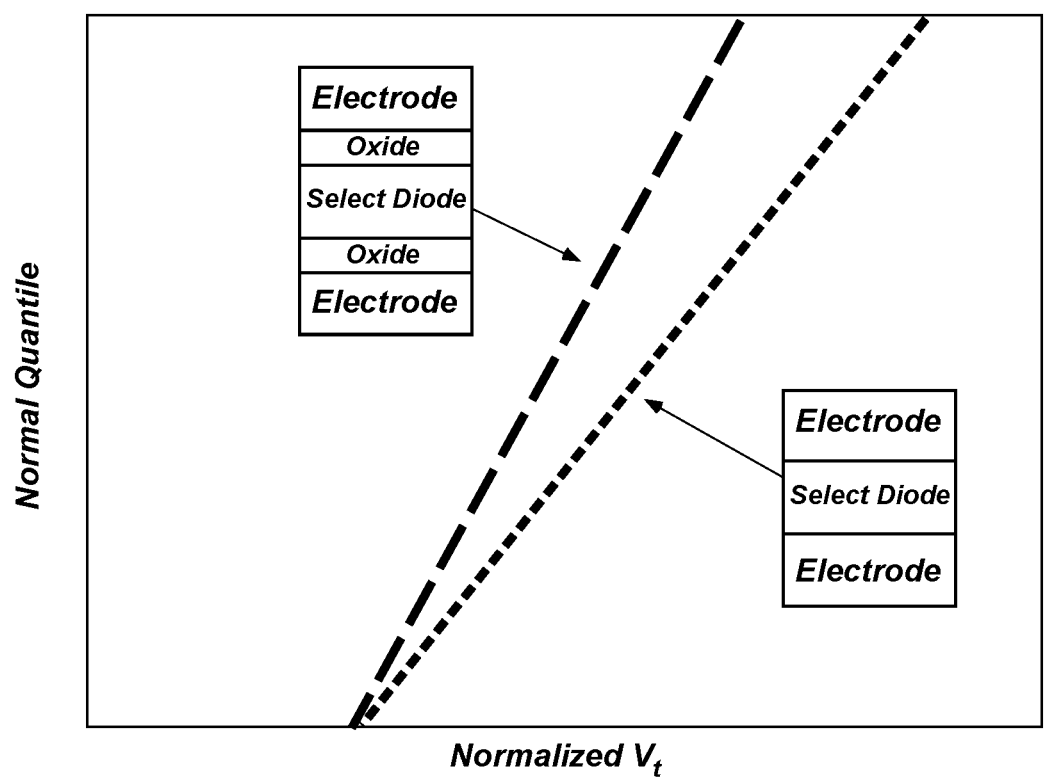
FIG. 10 is a graphical representation comparing the threshold voltage variability of the memory cells of the present disclosure to conventional memory cells.

FIG. 10 is a graphical representation of the threshold voltage distribution of a memory cell array having memory cells including intervening dielectric materials between a threshold switching material and adjacent electrodes compared to a threshold voltage distribution of a conventional memory cell array. A 10 Å $Al_2O_3$ dielectric material was formed over a 100 Å carbon containing electrode. An approximately 120 Å thick chalcogenide threshold switching material including germanium, selenium, and arsenic atoms was formed over the $Al_2O_3$ dielectric material. Another 10 Å $Al_2O_3$ dielectric material was formed over the chalcogenide threshold switching material. Another 100 Å carbon containing electrode was formed over the $Al_2O_3$ dielectric material. The threshold voltage of the memory cells including the intervening dielectric materials exhibited a generally lower threshold voltage and a tighter distribution of threshold voltages compared to the conventional memory cells that lack the dielectric materials between the threshold switching material and electrodes. The threshold voltage of the each memory cell in the memory array was closer to the average threshold voltage of the plurality of memory cells in the memory array than in conventional memory cell arrays (i.e., the threshold voltage of each memory cell within the memory array including the dielectric materials between the threshold switching material and the electrodes have a smaller standard deviation than conventional memory cells that lack the dielectric materials). The standard deviation of the threshold voltage of the memory cells including the intervening dielectric is reduced compared to a standard deviation of the threshold voltage of memory cells in a conventional memory cell.

The leakage current of the memory cells including the intervening dielectric materials remained stable after several on/off cycles were been performed at different leakage current densities. After approximately 1e6 (one million) on/off cycles, the memory cells remained stable without an increased amount of current leaking through the memory cells. The memory cells remained stable through a wide range of pulsing widths with each pulse width ranging from about milliseconds to about nanoseconds and over a wide range of current pulses through the memory cells.

Example 2

Figure 11A:
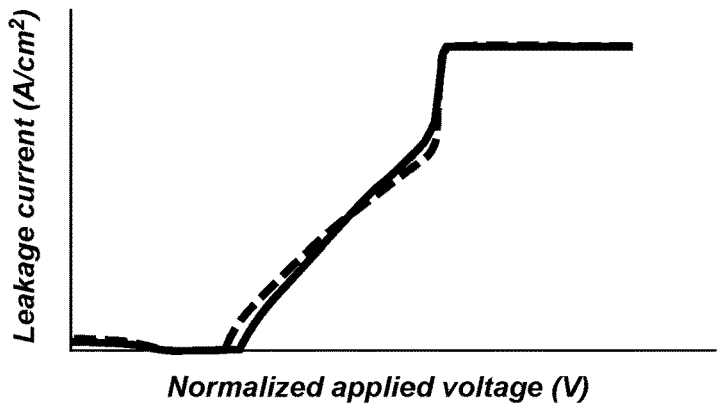
FIG. 11A through FIG. 11D are graphical representations comparing device performance of a memory cell of the present disclosure to a conventional memory cell.
Figure 11B:
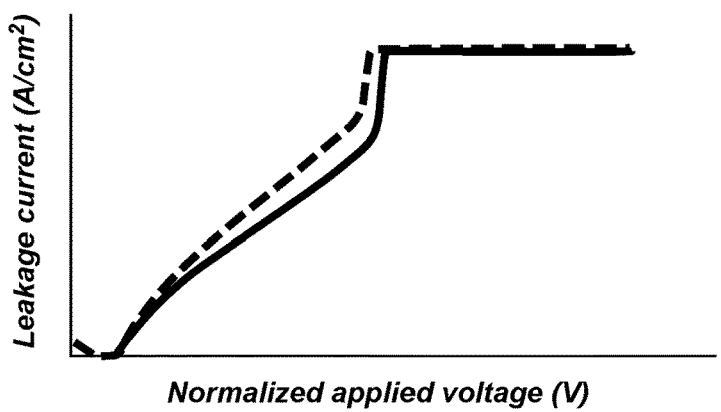
Figure 11C:
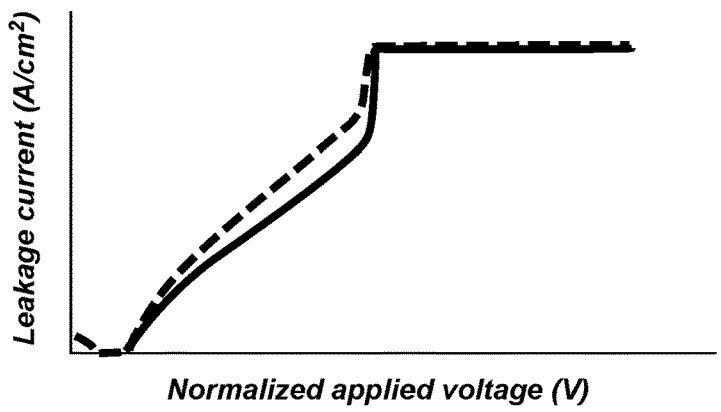
Figure 11D:
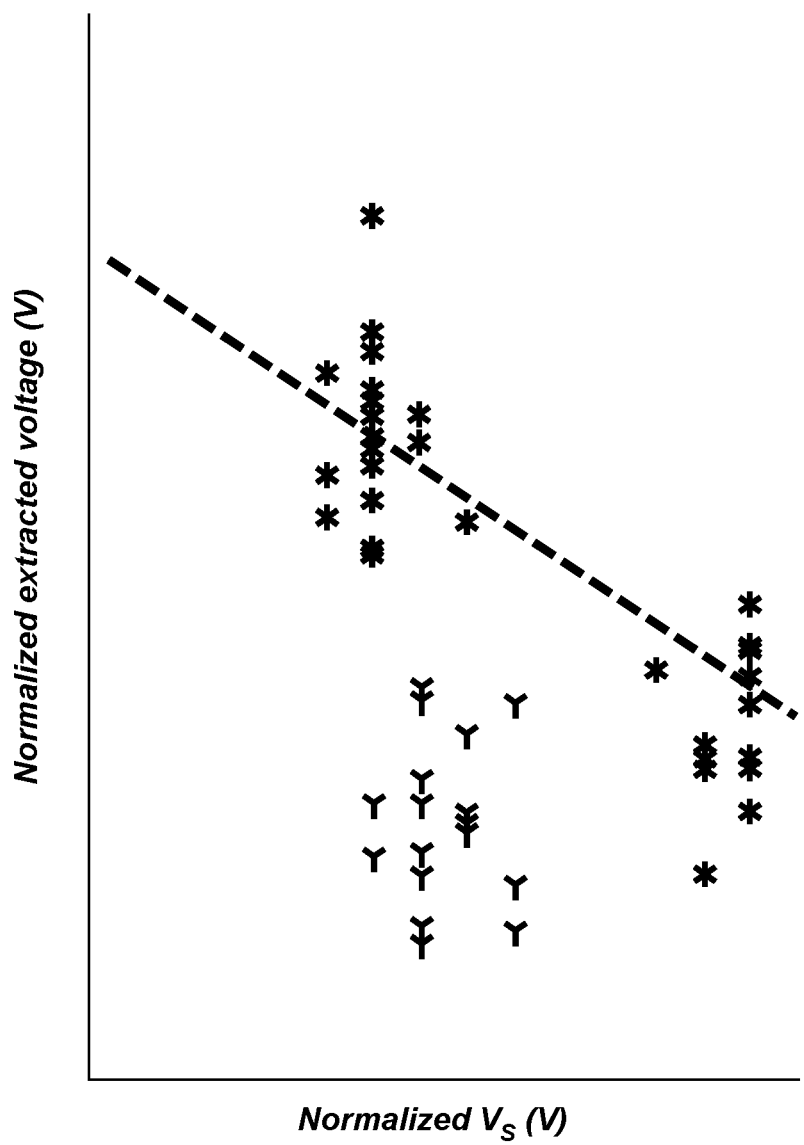

Referring to FIG. 11A through FIG. 11C, graphical representations of the leakage current of a memory cell including an intervening dielectric material between a threshold switching material and an electrode is shown and compared to a conventional memory cell lacking the intervening dielectric material. The conventional memory cell is shown in a broken line and the memory cell including the intervening dielectric material is shown as a solid line. A 10 Å $TiO_2$ dielectric material was formed over a metal electrode. An amorphous silicon threshold switching material was formed over the $TiO_2$ dielectric material. Another electrode was formed over the amorphous silicon threshold switching material. Referring to FIG. 11A, the leakage current of the memory cells including the $TiO_2$ dielectric material was about the same as that of a conventional memory cell in the first cycle. Referring to FIG. 11B and FIG. 11C, during the second cycle and the tenth cycle, respectively, the leakage current through the memory cell including the $TiO_2$ dielectric material was lower than the leakage current through the conventional memory cell. Referring to FIG. 11D, the memory cell including the $TiO_2$ dielectric material had a reduced leakage voltage compared to the conventional memory cell. The memory cells including the $TiO_2$ dielectric material were stable after a high number of cycles (e.g., about one million cycles) over a broad range of pulsing widths. The memory cells including the $TiO_2$ dielectric material were more stable than the conventional memory cells, particularly after a higher number of cycles and at greater pulse widths.

While certain illustrative embodiments have been described in connection with the figures, those of ordinary skill in the art will recognize and appreciate that embodiments encompassed by the disclosure are not limited to those embodiments explicitly shown and described herein. Rather, additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A method of forming a memory cell, the method comprising:
   forming a threshold switching material comprising amorphous silicon between a pair of electrodes;
   forming at least one dielectric material between the threshold switching material and at least one electrode of the pair of electrodes;
   doping the at least one dielectric material; and
   forming a memory material adjacent at least one of the electrodes of the pair of electrodes.

2. The method of claim 1, wherein forming a threshold switching material comprises forming the threshold switching material to comprise amorphous silicon doped with at least one of boron, aluminum, gallium, nitrogen, or phosphorus.

3. The method of claim 1, wherein forming at least one dielectric material between the threshold switching material and at least one electrode of the pair of electrodes comprises forming a dielectric material between the threshold switching material and each electrode of the pair of electrodes.

4. The method of claim 1, wherein forming at least one dielectric material between the threshold switching material and at least one electrode of the pair of electrodes comprises:
   forming a first dielectric material between the threshold switching material and a first electrode of the pair of electrodes; and
   forming a second dielectric material between the threshold switching material and a second electrode of the pair of electrodes, the second dielectric material having a different chemical composition than the first dielectric material.

5. The method of claim 1, wherein forming a threshold switching material comprising amorphous silicon between a pair of electrodes comprises forming a threshold switching material proximate an electrode comprising a metal, a metal silicide, or polysilicon.

6. The method of claim 1, wherein doping the at least one dielectric material comprises doping the at least one dielectric material with oxygen, sulfur, carbon, fluorine, a metal, or combinations thereof.

7. The method of claim 1, wherein forming a threshold switching material comprising amorphous silicon comprises forming a threshold switching material comprising amorphous silicon and between about 1 atomic percent and about 30 atomic percent of at least one of carbon, oxygen, or nitrogen.

8. The method of claim 1, wherein forming at least one dielectric material comprises forming at least one dielectric material comprising titanium dioxide.

9. A method of forming a semiconductor device, the method comprising:
   forming a first dielectric material adjacent to a first electrode comprising carbon;
   forming a threshold switching material adjacent to the first dielectric material and opposite the first electrode;
   forming a second dielectric material adjacent to the threshold switching material and opposite the first dielectric material, the second dielectric material having a different chemical composition than the first dielectric material;
   doping at least one of the first dielectric material or the second dielectric material; and
   forming a second electrode adjacent to the second dielectric material and opposite the threshold switching material.

10. The method of claim 9, further comprising doping each of the first dielectric material and the second dielectric material.

11. The method of claim 9, wherein forming a threshold switching material comprises forming a threshold switching material comprising a chalcogenide compound.

12. The method of claim 9, wherein forming a first dielectric material comprises forming a first dielectric material having a thickness between about 3 Å and about 50 Å.

13. The method of claim 9, wherein forming a first dielectric material comprises forming a first dielectric material comprising aluminum oxide.

14. The method of claim 9, wherein forming a first dielectric material comprises forming a first dielectric material comprising silicon oxynitride, aluminum oxynitride, silicon nitride, aluminum nitride, hafnium nitride, zirconium nitride, carbon oxynitride, or combinations thereof adjacent to the first electrode.

15. The method of claim 9, wherein forming a first dielectric material comprises forming a first dielectric material comprising aluminum oxide adjacent to the first electrode and the threshold switching material.

16. The method of claim 9, wherein doping at least one of the first dielectric material or the second dielectric material comprises forming the at least one of the first dielectric material or the second dielectric material to have a higher concentration of a dopant at an interface of the threshold switching material and at least one of the first dielectric material or the second dielectric material than at other portions of the respective at least one of the first dielectric material or the second dielectric material.

17. A method of forming a semiconductor device, the method comprising:
   forming a threshold switching material between a first dielectric material and a second dielectric material and adjacent to a first electrode material;
   doping the first dielectric material and the second dielectric material;
   forming a second electrode material adjacent to the second dielectric material;
   forming a memory material adjacent to the second electrode material; and
   patterning the first electrode material, the first dielectric material, the threshold switching material, the second dielectric material, the second electrode material, and the memory material to form isolated stack structures.

18. The method of claim 17, wherein forming a threshold switching material comprises forming a threshold switching material comprising amorphous silicon.

* * * * *